United States Patent
Iwamoto

(10) Patent No.: US 9,876,477 B2
(45) Date of Patent: Jan. 23, 2018

(54) OPERATIONAL AMPLIFIER CIRCUIT

(71) Applicant: FUJI ELECTRIC CO., LTD., Kawasaki-shi, Kanagawa (JP)

(72) Inventor: Motomitsu Iwamoto, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/150,542

(22) Filed: May 10, 2016

(65) Prior Publication Data
US 2016/0373077 A1 Dec. 22, 2016

(30) Foreign Application Priority Data
Jun. 18, 2015 (JP) .................. 2015-122935

(51) Int. Cl.
*H03F 3/45* (2006.01)
*H03F 3/30* (2006.01)

(52) U.S. Cl.
CPC ....... *H03F 3/45192* (2013.01); *H03F 3/3001* (2013.01); *H03F 3/45* (2013.01); *H03F 3/45071* (2013.01); *H03F 3/45179* (2013.01); *H03F 3/45183* (2013.01); *H03F 2203/45248* (2013.01); *H03F 2203/45264* (2013.01); *H03F 2203/45342* (2013.01); *H03F 2203/45692* (2013.01)

(58) Field of Classification Search
CPC .... H03F 3/45192; H03F 3/45; H03F 3/45179; H03F 3/45183; H03F 3/45188; H03F 1/307; H03F 3/30; H03F 3/3001; H03F 3/3022; H03F 3/45071; H03F 1/3211

USPC .................. 330/253, 255, 259, 261
See application file for complete search history.

(56) References Cited

U.S. PATENT DOCUMENTS

| | | | | |
|---|---|---|---|---|
| 5,805,021 A | * | 9/1998 | Brehmer | ............. H03F 3/45076 330/255 |
| 7,078,971 B2 | * | 7/2006 | Colbeck | ............. H03F 3/45192 330/255 |
| 7,113,042 B2 | * | 9/2006 | Richard | .................... H03F 1/26 330/253 |
| 7,570,113 B2 | * | 8/2009 | Welty | ....................... H03F 1/52 330/255 |

(Continued)

OTHER PUBLICATIONS

Hirokazu Yoshizawa, "CMOS OP Amplifier Circuit, Basics of Practical Design", the first edition, CQ Publishing Co., Ltd., May 15, 2007, pp. 136-141.

*Primary Examiner* — Khanh V Nguyen
(74) *Attorney, Agent, or Firm* — Rabin & Berdo, P.C.

(57) ABSTRACT

In a folded cascode operational amplifier circuit, a source is connected to a back gate in each of third and fourth transistors that are cascode-connected to first and second transistors, which are an electric current source that returns an electric current signal output by a differential pair of an input stage. In the third and fourth transistors, an active parasitic element exists due to its device structure. When a falling edge signal of a rectangular wave is input, and electric current is supplied to the source of the third transistor to increase its electric potential, electric current flows into the drain from the back gate via the active parasitic element in an on state, in order to rapidly charge a capacitor. Thereby, a fifth transistor turns on within a shorter time, in order to improve an internal slew rate.

10 Claims, 8 Drawing Sheets

(56) References Cited

U.S. PATENT DOCUMENTS

| | | | |
|---|---|---|---|
| 7,884,671 B2 * | 2/2011 | Chung | H03F 3/301 330/255 |
| 8,970,302 B2 * | 3/2015 | Schulz | H03F 3/45273 330/261 |
| 2002/0125950 A1 | 9/2002 | Abe | |

* cited by examiner

US 9,876,477 B2

OPERATIONAL AMPLIFIER CIRCUIT

CROSS-REFERENCE TO RELATED APPLICATION

This application is based upon and claims the benefit of priority of the prior Japanese Patent Application No. 2015-122935, filed on Jun. 18, 2015, the entire contents of which are incorporated herein by reference.

BACKGROUND OF THE INVENTION

1. Field of the Invention

The embodiments discussed herein relate to an operational amplifier circuit.

2. Background of the Related Art

Operational amplifiers are utilized as analog signal amplifiers or digital signal comparators, and a two stage configuration including an input stage of a differential amplifier circuit and an output stage of a common source circuit is widely known (for example, refer to Hirokazu Yoshizawa, "CMOS OP Amplifier Circuit, Basics of Practical Design", the first edition, CQ Publishing Co., Ltd., May 15, 2007, pp. 137-139).

FIG. 6 is a circuit diagram illustrating an example of a basic two-stage operational amplifier circuit. FIG. 7 is a circuit diagram illustrating a configuration of a voltage follower utilizing the operational amplifier circuit. FIG. 8 illustrates an example of input-output characteristics of the voltage follower.

The basic operational amplifier circuit includes P channel MOSFETs (hereinafter, referred to as PMOS transistor) M1, M2, and M3 and N channel MOSFETs (hereinafter, referred to as NMOS transistor) M4 and M5, as an input stage, as illustrated in FIG. 6. Also, the operational amplifier circuit includes a PMOS transistor M6 and an NMOS transistor M7 as an output stage.

A PMOS differential pair including the PMOS transistors M2 and M3 amplifies the difference between common-mode input voltages that are applied to a pair of input terminals IN+ and IN−. A predetermined constant voltage is applied on a bias terminal Bias, so that the PMOS transistor M1 provides an electric current source for the PMOS differential pair. A current mirror circuit including the NMOS transistors M4 and M5 is an active load of the PMOS differential pair. A connection point between the PMOS transistor M3 and the NMOS transistor M5 is connected to the NMOS transistor M7 of the output stage. A connection point between the NMOS transistor M7 and the PMOS transistor M6 that provides an electric current source for the NMOS transistor M7 is connected to an output terminal Vout. Also, in this operational amplifier circuit, a series circuit consisting of a phase compensation capacitor C1 and a resistance R1 is connected to the gate and the drain of the NMOS transistor M7.

The operation of the operational amplifier circuit of the above configuration, which is utilized as a voltage follower, will be described. As illustrated in FIG. 7, the voltage follower is a non-inverting amplifier circuit whose amplification rate is 1, and its input terminal Vin corresponds to the input terminal IN+ illustrated in FIG. 6, and its output terminal Vout is connected to the input terminal IN− illustrated in FIG. 6.

Here, a rectangular wave signal is assumed to be input into the voltage follower. The PMOS transistor M3 of the PMOS differential pair is turned off, when a high level voltage of a rectangular wave (for example, a voltage close to the power supply voltage VDD) is input into the input terminal Vin. Thereby, the ground potential (0V) is applied to the gate of the NMOS transistor M7 of the output stage, in order to turn off the NMOS transistor M7, and the voltage close to the power supply voltage VDD is output to the output terminal Vout via the PMOS transistor M6, as illustrated in FIG. 8.

Next, a situation in which a falling edge signal of a rectangular wave (for example, a voltage that drops to the ground potential) is input into the input terminal Vin will be described (for example, refer to Hirokazu Yoshizawa, "CMOS OP Amplifier Circuit, Basics of Practical Design", the first edition, CQ Publishing Co., Ltd., May 15, 2007, pp. 137-139, FIGS. 7-39). When a falling edge signal of a rectangular wave is input, the PMOS transistor M3 of the PMOS differential pair turns on immediately. In this case, all electric current flowing in the PMOS transistor M1 flows into the PMOS transistors M3. On the other hand, electric current does not flow in the PMOS transistor M2 of the PMOS differential pair, and therefore electric current does not flow in the NMOS transistor M4 and in the NMOS transistor M5 having a common gate with the NMOS transistor M4. Thus, all electric current flowing in the PMOS transistor M3 flows into the capacitor C1 in order to charge the capacitor C1. Simultaneously, the NMOS transistor M7 is turned on by a rise of the gate voltage of the NMOS transistor M7, and the voltage of the output terminal Vout starts falling as illustrated in FIG. 8.

The voltage of the output terminal Vout falls as the capacitor C1 is charged, and the voltage of the output terminal Vout becomes equal to the voltage of the input terminal Vin, when the gate voltages of the PMOS transistors M2 and M3 become equal. Thereby, equal amounts of electric currents flow in the PMOS transistors M2 and M3, and equal amounts of electric currents flow in the NMOS transistors M4 and M5 of the current mirror circuit as well. As the equal amounts of the electric currents flow in the PMOS transistor M3 and the NMOS transistor M5, the capacitor C1 is fully charged.

As described above, when the falling edge signal of the rectangular wave is input into the input terminal Vin of the voltage follower, the capacitor C1 is charged by a bias current that flows in the PMOS transistor M1, and the voltage of the output terminal Vout falls. The charge into the capacitor C1 is completed, when the voltage of the output terminal Vout falls to the ground potential. In this case, a slew rate, i.e., a value obtained by dividing the voltage of the output terminal Vout by the time taken for the voltage of the output terminal Vout to fall, is dependent on the capacitance value of the capacitor C1 and the current value for charging the capacitor C1.

Here, the time taken for the voltage of the output terminal Vout to fall is to be shortened in order to make a high-speed operational amplifier circuit of a high slew rate at a falling edge of a rectangular wave. The capacitance value of the capacitor C1 may be reduced, or the current value for charging the capacitor C1 may be increased, in order to shorten the time taken for the voltage of the output terminal Vout to fall, and to make the slope of the falling edge steeper.

However, the capacitance value of the phase compensation capacitor depends on the condition of phase compensation, and therefore it is difficult to make a small change in order to improve the slew rate. On the other hand, as the current value for charging the capacitor increases, the current value of the electric current source that supplies electric current to the differential pair of the input stage increases, and accordingly the bias current increases. Such increase of the bias current is very disadvantageous for an operational amplifier circuit employed in a mobile device, which preferably consumes less electric power, particularly.

SUMMARY OF THE INVENTION

According to one aspect, there is provided a folded cascode operational amplifier circuit including: a first electric current source including a P-channel transistor; a differential pair including P-channel transistors, wherein electric current is supplied from the first electric current source to the differential pair, and a differential voltage is input into the differential pair; a second electric current source including a pair of N-channel transistors that return electric current output from the differential pair; a cascode circuit including a pair of N-channel transistors that are cascode-connected to the second electric current source; a third electric current source including a pair of P-channel transistors, for supplying electric current to the cascode circuit; an N-channel output transistor configured to amplify a voltage output from a node of connection between the cascode circuit and the third electric current source; and a phase compensation capacitor connected to the node, wherein each of the transistors of the cascode circuit includes a source and a back gate connected to each other.

The object and advantages of the invention will be realized and attained by means of the elements and combinations particularly pointed out in the claims.

It is to be understood that both the foregoing general description and the following detailed description are explanatory and are provided by way of examples, and are not restrictive of the scope of the invention.

DETAILED DESCRIPTION OF THE INVENTION

Figure 1:
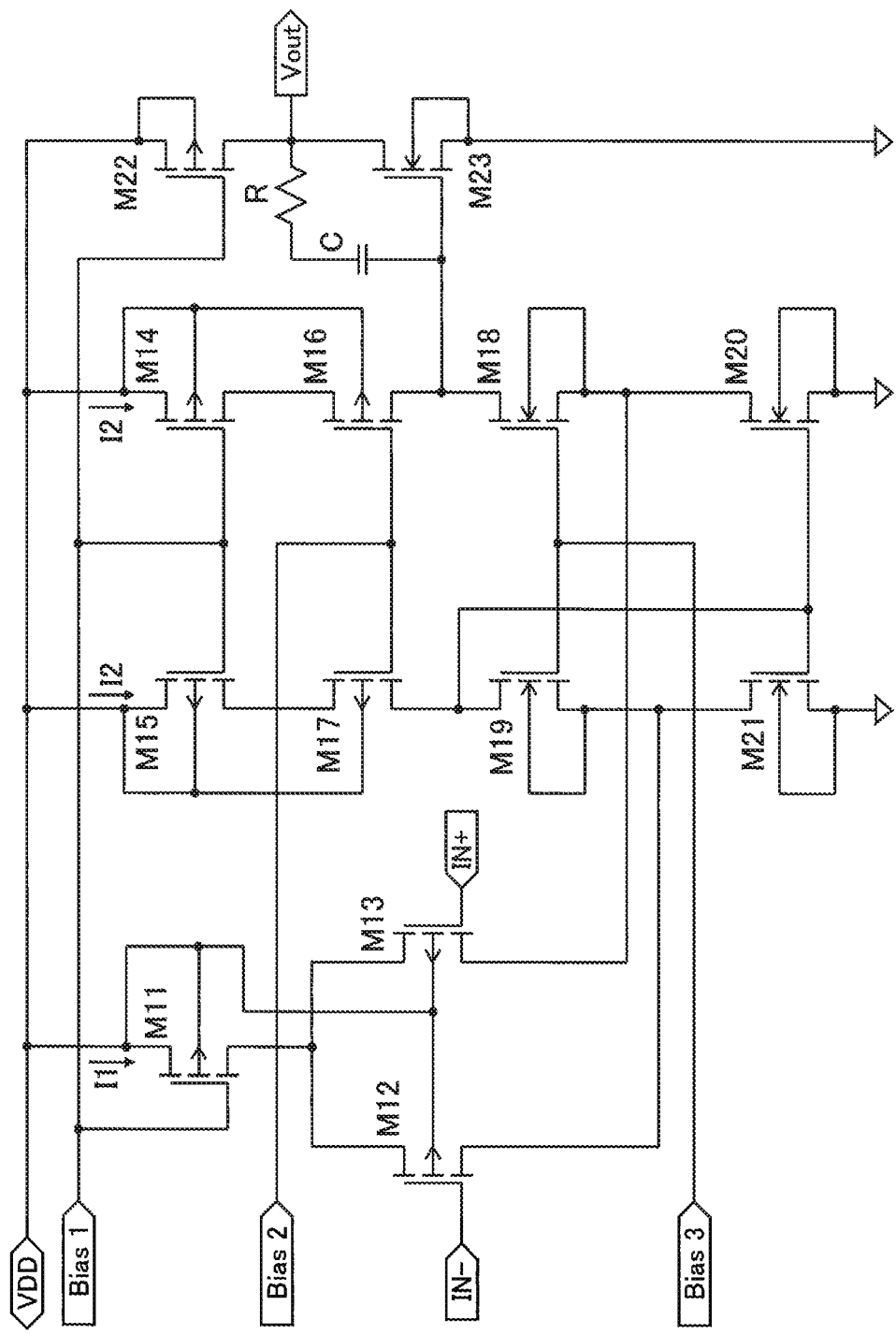
FIG. 1 is a circuit diagram illustrating an operational amplifier circuit according to a first embodiment.

Several embodiments will be described below with reference to the accompanying drawings, wherein like reference numerals refer to like elements throughout.

Note that, in the following description, the same reference sign is sometimes used for both of the name of a terminal and a voltage, a signal, or the like of the terminal. Also, each embodiment may be created by combining a plurality of embodiments without inconsistency.

Figure 2:
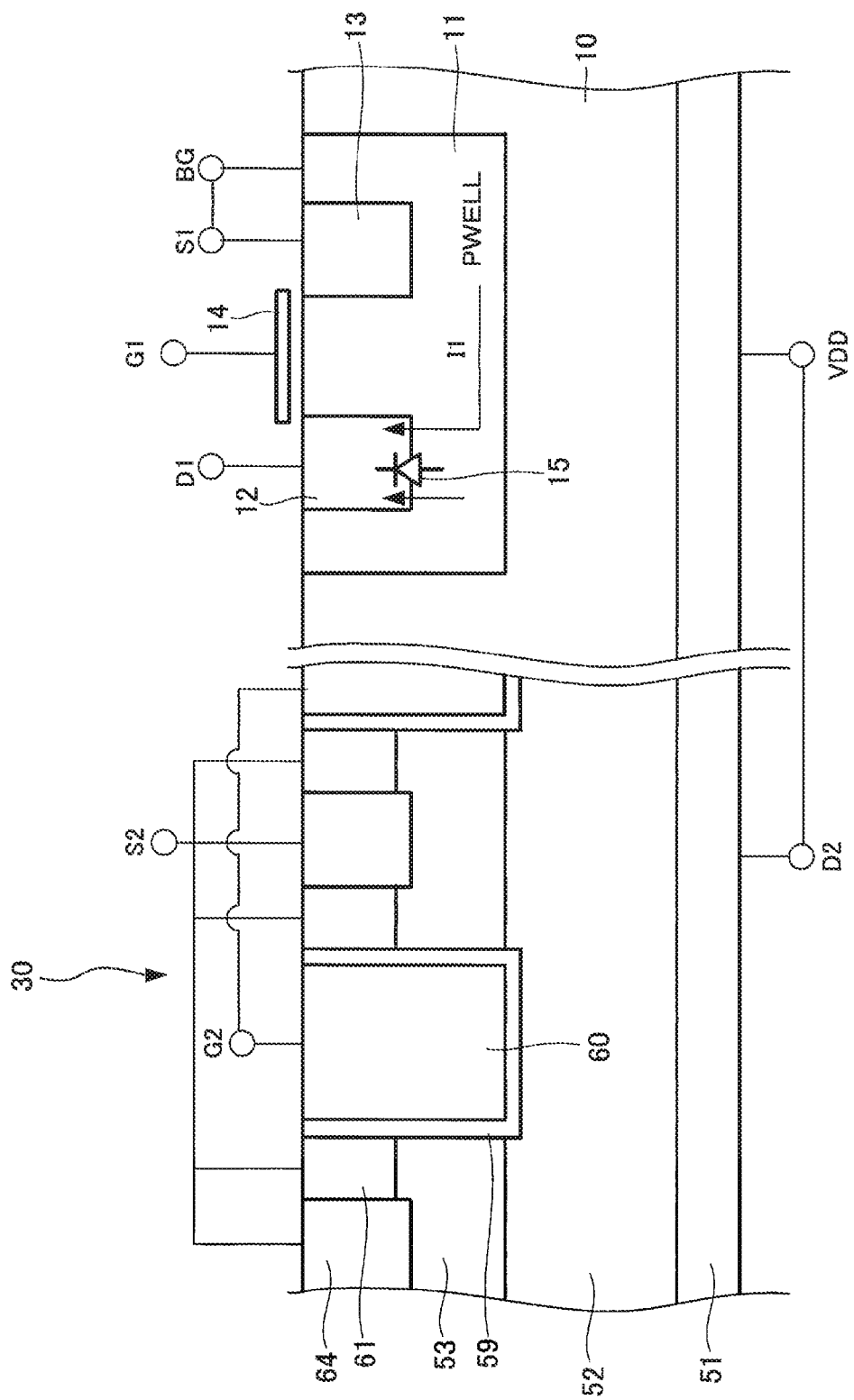
FIG. 2 is a cross-sectional view illustrating a structure of an NMOS transistor that is cascode-connected to a folded electric current source.

FIG. 1 is a circuit diagram illustrating an operational amplifier circuit according to the first embodiment. FIG. 2 is a cross-sectional view illustrating a structure of an NMOS transistor that is cascode-connected to a folded electric current source.

The operational amplifier circuit according to the first embodiment is a folded cascode operational amplifier circuit, which includes an input stage, an intermediate stage, and an output stage.

The input stage includes a PMOS transistor M11 as an electric current source, and a PMOS differential pair consisting of PMOS transistors M12 and M13. With regard to the PMOS transistor M11, its source and back gate are connected to a power supply terminal VDD, and its gate is connected to a bias terminal Bias1, and its drain is connected to the sources of the PMOS transistors M12 and M13. With regard to the PMOS transistors M12 and M13, their gates are connected to input terminals IN− and IN+, and their back gates are connected to the power supply terminal VDD.

The intermediate stage includes PMOS transistors M14, M15, M16, and M17, and NMOS transistors M18, M19, M20, and M21. Here, the NMOS transistors M20 and M21 provide an electric current source, and the PMOS differential pair of the input stage and the NMOS transistors M18 and M19 are cascode-connected to the electric current source. The NMOS transistors M18 and M19 are connected to the PMOS transistors M14, M15, M16, and M17 as an active load.

That is, with regard to the NMOS transistors M20 and M21, their sources and the back gates are connected to the ground, and their gates are connected to the drain of the NMOS transistor M19. The drain of the NMOS transistor M20 is connected to the drain of the PMOS transistor M13 of the PMOS differential pair and the source of the NMOS transistor M18. The drain of the NMOS transistor M21 is connected to the drain of the PMOS transistor M12 of the PMOS differential pair and the source of the NMOS transistor M19. With regard to the NMOS transistors M18 and M19, their gates are connected to a bias terminal Bias3, and their drain are connected to the drains of the PMOS transistors M16 and M17.

With regard to the PMOS transistors M16 and M17, their gates are connected to a bias terminal Bias2, and their sources are connected to the drains of the PMOS transistors M14 and M15. With regard to the PMOS transistors M14 and M15, their gates are connected to the bias terminal Bias1, and their sources are connected to the power supply terminal VDD. The back gates of the PMOS transistors M14, M15, M16, and M17 are connected to the power supply terminal VDD.

Note that, with regard to the PMOS transistors M11, M14, and M15, their gates are connected to the same bias terminal Bias1, and the electric currents flowing therein are controlled by the same bias voltage. Note that the electric current I1 flowing in the PMOS transistor M11 is larger than the electric current I2 flowing in the PMOS transistors M14 and M15. In order to realize this relationship, although not depicted, the PMOS transistor M11 is configured with two PMOS elements connected in parallel for example, so that the electric current I1 is twice as large as the electric currents I2 of the PMOS transistors M14 and M15.

The output stage includes a PMOS transistor M22 and an NMOS transistor M23. With regard to the NMOS transistor M23, the source and the back gate are connected to the ground, and the gate is connected to a connection point between the drain of the PMOS transistor M16 and the drain of the NMOS transistor M18. The drain of the NMOS transistor M23 is connected to the drain of the PMOS transistor M22 and the output terminal Vout. Also, a series circuit consisting of a phase compensation capacitor C and a resistance R is connected to the gate and the drain of the NMOS transistor M23. With regard to the PMOS transistor M22, the source and the back gate are connected to the power supply terminal VDD, and the gate is connected to the bias terminal Bias1. Note that a constant voltage circuit block is connected to each of the bias terminals Bias1, Bias2, and Bias3, in order to input a predetermined bias voltage.

Here, with regard to the NMOS transistors M18 and M19 that are cascode-connected to the NMOS transistors M20 and M21 of the electric current source, their back gates are not connected to the ground, but to the sources of themselves, respectively.

As illustrated in FIG. 2, the device structure is such that a P well 11 is formed in a surface layer of an N-type semiconductor substrate 10, and the NMOS transistors M18 and M19 are formed on the P well 11. That is, two N regions 12 and 13 of a drain D1 and a source S1 are formed by a diffusion method or the like at the upper portion of the P well 11, and a gate electrode 14 is formed on the P well 11 between the source and the drain, with a gate oxide film (not illustrated) therebetween. The P well 11 forms a back gate BG, and the power supply terminal VDD is connected to the N-type semiconductor substrate 10. Also, the N-type semiconductor substrate 10 is formed with a vertical MOSFET 30 including a source S2 located at the front surface side on which the NMOS transistors M18 and M19 are formed, as well as a drain D2 located at the back surface side in a region away from the P well 11. The vertical MOSFET 30 includes an N+ drain region 51, an N− drift region 52 (an N-type semiconductor substrate 10), a P channel region 53, a P+ contact region 64, an N+ source region 61, a gate insulating film 59, and a gate electrode 60.

The device structures of the NMOS transistors M18 and M19 include NPN structures, in other words, bipolar transistor structures directly below the N region 12, and an active parasitic element exists inevitably. Thus, a body diode 15 formed between the P well 11 and the N region 12 has parasitic behavior, depending on the operating condition of the NMOS transistor M18. Specifically, as the back gate BG of the NMOS transistor M18 is connected to the source S1, the electric current injected into the source S1 flows into the drain D1 due to the parasitic behavior of the body diode 15.

Although only the back gate of the NMOS transistor M18 is connected to the source in a single-end operational amplifier circuit, the NMOS transistor M19 has the same circuit configuration in the folded cascode, because of its paired configuration. This is because, if the back gate of the NMOS transistor M19 alone is connected to the ground, a threshold value changes, and thereby characteristics changes.

According to the folded cascode operational amplifier circuit having the above configuration, voltage signals applied to the input terminals IN− and IN+ are converted to electric current signals by the PMOS transistors M12 and M13 of the PMOS differential pair. Thereafter, the electric current signals are returned by utilizing the electric current sources of the NMOS transistors M20 and M21. At this time, the electric current signals are converted to other electric current signals by the NMOS transistors M18 and M19, and further the electric current signals are converted to a voltage signal by the PMOS transistors M14, M15, M16, and M17. This voltage signal is amplified by the NMOS transistor M23 and is output from the output terminal Vout.

Next, an operation performed when the folded cascode operational amplifier circuit is used as a voltage follower, particularly an operation performed when a falling edge signal of a rectangular wave is input, will be described.

Figure 3:
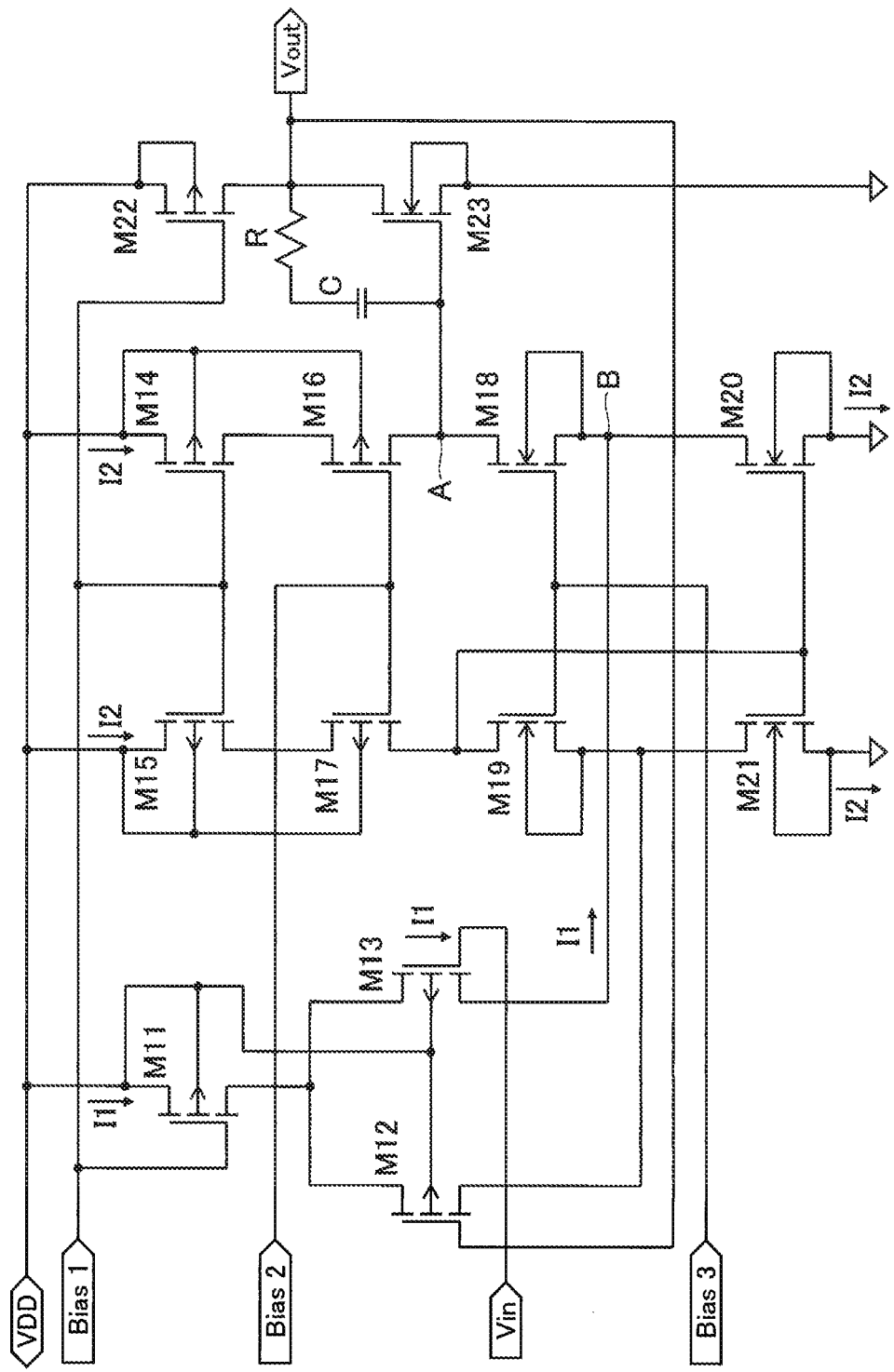
FIG. 3 is a circuit diagram illustrating a configuration of an operational amplifier circuit according to the first embodiment, which is used as a voltage follower.
Figure 4:
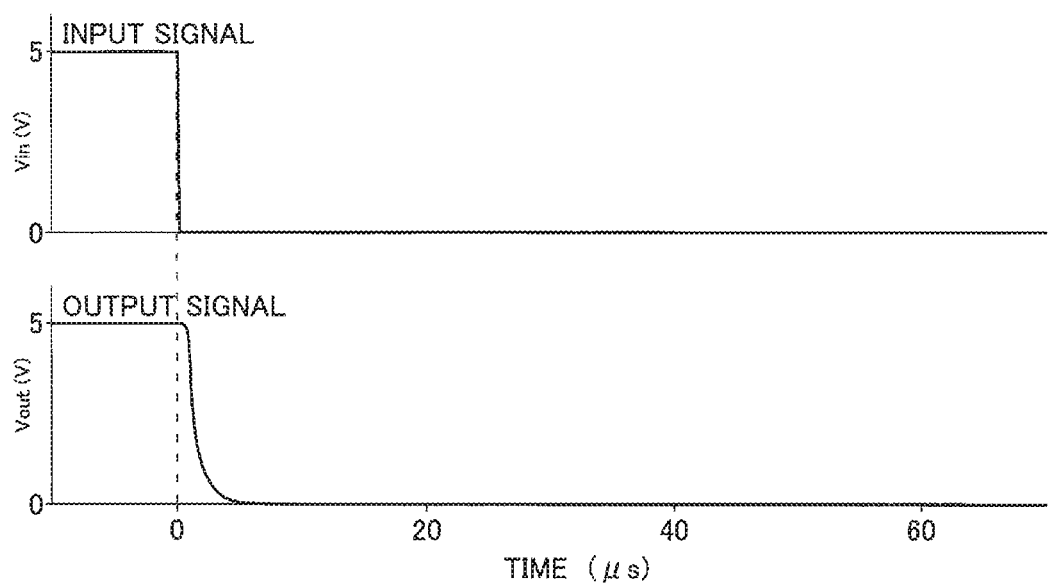
FIG. 4 illustrates an example of input-output characteristics of a voltage follower.

FIG. 3 is a circuit diagram illustrating a configuration of the operational amplifier circuit according to the first embodiment, which is used as a voltage follower. FIG. 4 illustrates an example of input-output characteristics of the voltage follower.

As illustrated in FIG. 3, the voltage follower is a non-inverting amplifier circuit whose amplification rate is 1, in which an input terminal Vin corresponds to the input terminal IN+ illustrated in FIG. 1, and the output terminal Vout is connected to the input terminal IN− illustrated in FIG. 1.

First, in this operational amplifier circuit, the electric current I1 flows in the PMOS transistor M11 of the electric current source for the PMOS differential pair, and a smaller electric current I2 than the electric current I1 flows in the PMOS transistors M14 and M15. If a falling edge signal of a rectangular wave is input into the input terminal Vin of the voltage follower when both of the PMOS transistors M12 and M13 of the PMOS differential pair are in an off state, only the PMOS transistor M13 is turned on. Then, the electric current I1 of the PMOS transistor M11 flows in the PMOS transistor M13 and flows into a node B which is a connection point between the NMOS transistor M18 and the NMOS transistor M20.

At this time point, the PMOS transistor M12 remains turned off, and therefore all the electric current I1 flowing from the PMOS transistor M11 flows in the PMOS transistor M13. Also, the electric current does not flow from the PMOS differential pair into the NMOS transistor M21, and therefore only the electric current I2 flowing from the PMOS transistor M15 flows in the NMOS transistor M21. The same electric current as the electric current I2 flows in the NMOS transistor M20 having a common gate voltage with the NMOS transistor M21.

Thus, the electric current I1 flowing from the PMOS transistor M13, as well as the electric current I2 flowing from the PMOS transistor M14, flow into the node B, and the electric current flowing in the NMOS transistor M20 is limited to the electric current I2 by the NMOS transistor M21. That is, the electric current I1+I2 flows into the node B, whereas the electric current I2 flows out of the node B. Hence, the electric current I1 that flows into the node B increases the voltage of the node B.

When the voltage of the node B continues rising and becomes higher by a forward voltage of the body diode 15 than the voltage of a node A which is a connection point between the PMOS transistor M16 and the NMOS transistor M18, the NMOS transistor M18 starts parasitic behavior. That is, the body diode 15 turns on, and the electric current I1 flowing into the node B flows into the node A via the body diode 15. At this time, the active parasitic element including the body diode 15 has a bipolar transistor configuration, and therefore the electric current from the power supply terminal VDD is further amplified by a direct electric current amplification factor of the bipolar transistor and flows into the node A via the N-type semiconductor substrate 10.

Thereby, the voltage of the node A rises sharply, and the phase compensation capacitor C is rapidly charged, and the gate voltage of the NMOS transistor M23 rapidly rises. Then, the NMOS transistor M23 turns on, and the electric potential of the output terminal Vout rapidly decreases, as illustrated in FIG. 4. That is, the slew rate of the falling edge signal of the rectangular wave is increased, without reducing the capacitance value of the phase compensation capacitor, and without increasing the bias current.

The electric current I1 that flows in the PMOS transistor M11 is larger than the electric current I2 that flows in the PMOS transistors M14 and M15, in order to ensure the parasitic behavior in the NMOS transistor M18. That is, when a falling edge signal of a rectangular wave is input into the input terminal Vin, the electric current I1 flows into the node B to increase the electric potential of the node B, and thereby it is possible that the NMOS transistor M18 turns off due to increase of the electric potential at the source of the NMOS transistor M18. When the NMOS transistor M18 turns off, the NMOS transistor M20 at the source side of the NMOS transistor M18 can flow the electric current I2, and therefore if I1 is equal to I2, all the electric current I1 injected into the node B flows in the NMOS transistor M20. Thereby, the electric potential of the node B does not increase, so as to suppress the parasitic behavior of the NMOS transistor M18. To prevent that, I1 is made greater than I2 in order to increase the electric potential of the node B, so that the high electric current can be injected into the node A by the parasitic behavior of the NMOS transistor M18, even when the NMOS transistor M18 turns off.

Figure 5:
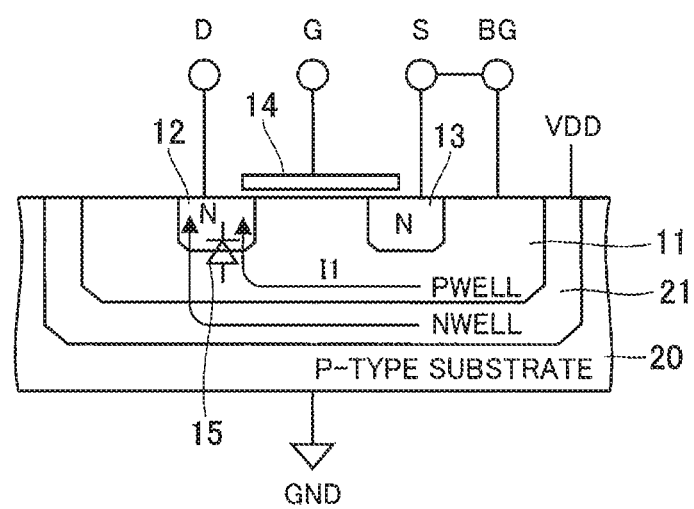
FIG. 5 is a cross-sectional view illustrating a structure of an NMOS transistor that is cascode-connected to a folded electric current source of an operational amplifier circuit according to a second embodiment.
Figure 6:
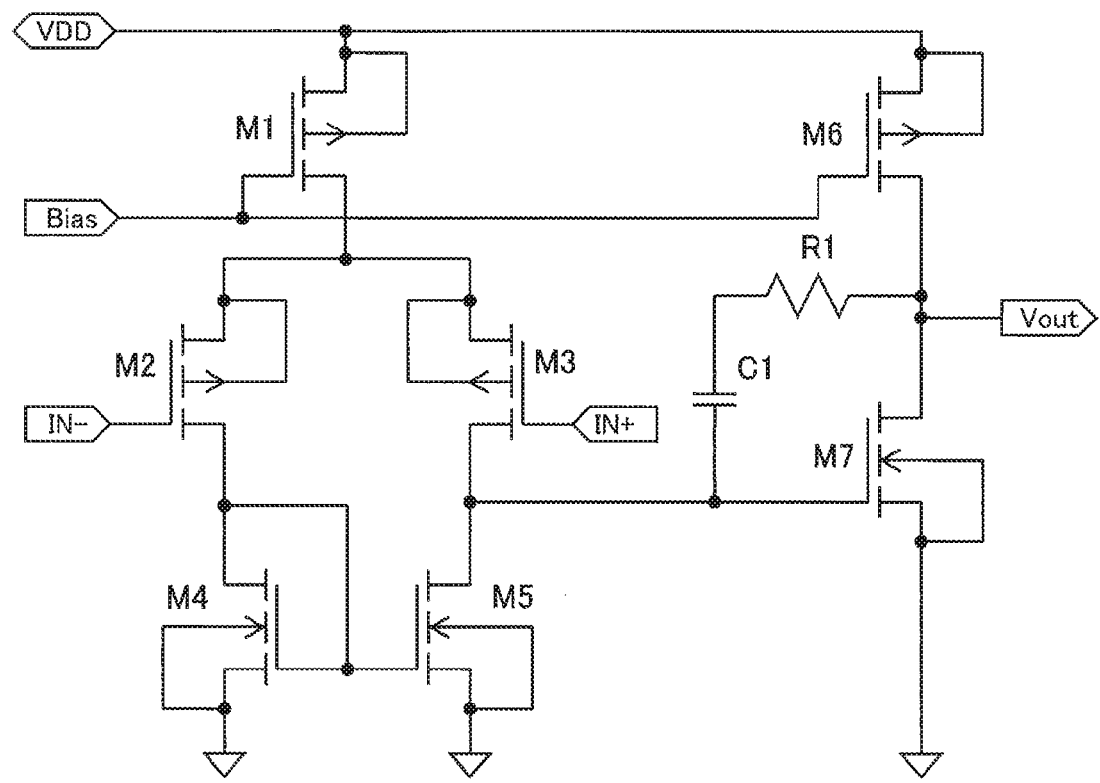
FIG. 6 is a circuit diagram illustrating an example of an operational amplifier circuit of a basic two stage configuration.
Figure 7:
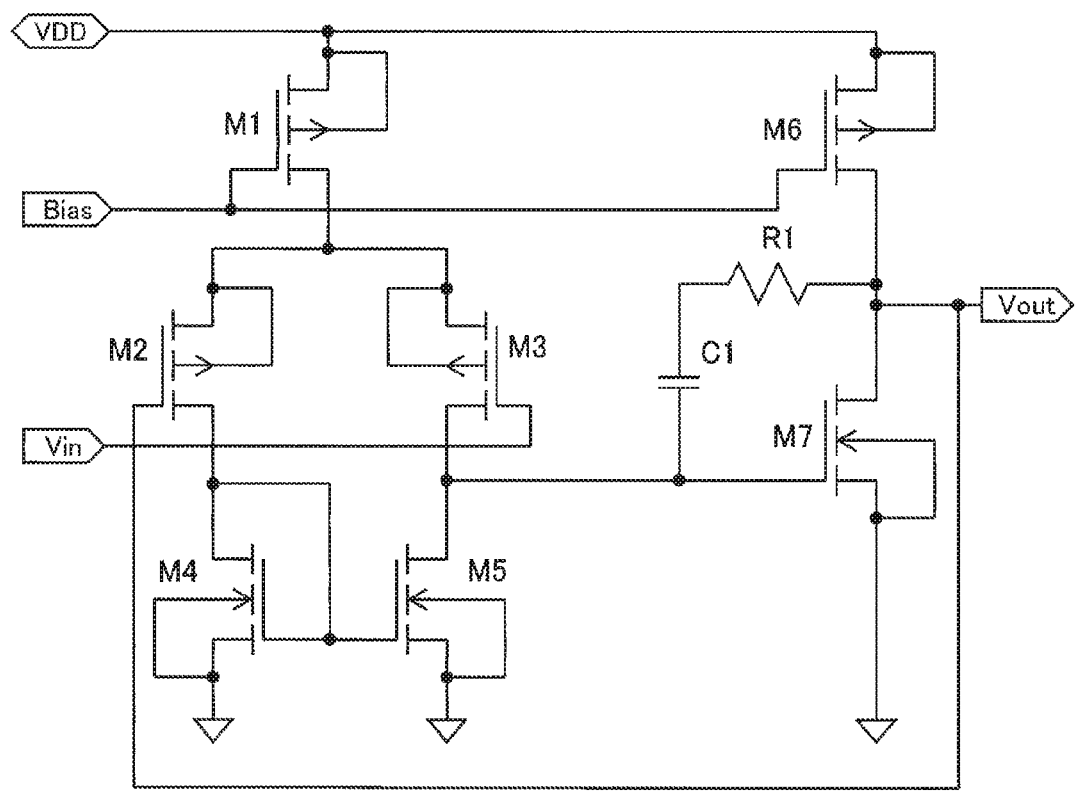
FIG. 7 is a circuit diagram illustrating a configuration of an operational amplifier circuit that is used as a voltage follower.
Figure 8:
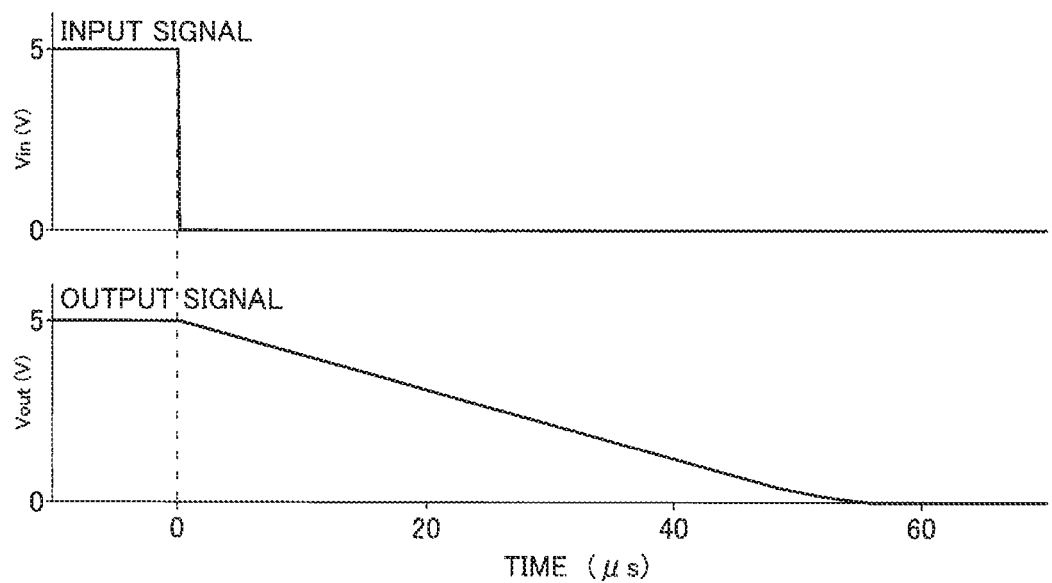
FIG. 8 illustrates an example of input-output characteristics of a voltage follower.

FIG. 5 is a cross-sectional view illustrating a structure of the NMOS transistor that is cascode-connected to the folded electric current source of the operational amplifier circuit according to the second embodiment. In this FIG. 5, the same or equivalent components as the components illustrated in FIG. 2 are denoted with the same reference signs, and their detailed description will be omitted.

This FIG. 5 illustrates a part of the operational amplifier circuit according to the second embodiment, which corresponds to the NMOS transistors M18 and M19 illustrated in FIG. 2. The operational amplifier circuit according to the second embodiment has the same circuit diagram as the operational amplifier circuit according to the first embodiment illustrated in FIG. 1, but is different in its device structure in which the NMOS transistors M18 and M19 are formed in a P-type semiconductor substrate 20. That is, in the device structure of the NMOS transistors M18 and M19, an N well 21 is first formed in the P-type semiconductor substrate 20, and the P well 11 is formed on the N well 21. Further, the NMOS transistors M18 and M19 are formed at the upper portion of the P well 11. That is, two N regions 12 and 13 of the drain D and the source S are formed at the upper portion of the P well 11, and the gate electrode 14 is formed on the P well 11 between the source and the drain, with a gate oxide film (not illustrated) therebetween. The P well 11 forms a back gate BG, and the power supply terminal VDD is connected to the N well 21, and the ground GND is connected to the P-type semiconductor substrate 20.

In this device structure as well, an active parasitic element having an NPN bipolar transistor structure exists directly below the N region 12. Thereby, the body diode 15 turns on, when the electric potential of the source S of the NMOS transistor M18 becomes equal to or higher than the electric potential of the drain D by the forward voltage of the body diode 15, because of the electric current injected into the source of the NMOS transistor M18. Then, the electric current injected into the source S flows into the drain D via the back gate BG, the P well 11, and the N region 12. Simultaneously, electric current flows from the power supply terminal VDD to the drain D via the N well 21, the P well 11, and the N region 12. The electric current that flows in the drain D is rapidly charged into the phase compensation capacitor C.

The above description just illustrates the principle of the present disclosure. Further, a large number of alterations and modifications can be made by those skilled in the art, and the present invention is not limited to the example configurations and applications described above. Although, in the above embodiment, the number of PMOS elements connected in parallel for configuring the PMOS transistor M11 is larger than that of the PMOS transistors M14 and M15 in order to make I1 larger than I2, the device structure may be changed, for example. That is, I1 can be made larger than I2, by increasing W/L, where W and L are the channel width and the channel length of the channel between the N regions 12 and 13 respectively. Alternatively, I1 can be made larger than I2, by setting and applying different bias voltages to the PMOS transistor M11 and the PMOS transistors M11, M14, and M15.

Although, in the above example, the operational amplifier circuit for amplifying a difference between analog signals has been described, the operational amplifier circuit may be applied to a comparator circuit having the same configuration. Note that, in such a comparator circuit, the phase compensation capacitor C is not provided in many cases. However, in this case as well, an input capacitance of an output transistor (a capacitance between gate and source) is rapidly charged, and therefore the internal slew rate is improved for a negatively stepped input voltage signal in the same way.

The operational amplifier circuit of the above configuration rapidly charges the capacitor by utilizing the active parasitic element of the cascode circuit, in order to increase the slew rate without increasing electric current consumption, and thus have the advantage of achieving both of low current consumption operation and high slew rate. Also, a capacitor having a capacitance value decided by a phase compensation condition can be employed without modification, and thus the capacitor is needless to be made more compact for the purpose of slew rate improvement.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A folded cascode operational amplifier circuit comprising:
    a first electric current source including a P-channel transistor;
    a differential pair including a first pair of P-channel transistors, wherein electric current is supplied from the first electric current source to the differential pair, and a differential voltage is input into the differential pair;
    a second electric current source including a first pair of N-channel transistors that return electric current output from the differential pair;
    a cascode circuit including a second pair of N-channel transistors that are cascode-connected to the second electric current source;
    a third electric current source including a second pair of P-channel transistors, for supplying electric current to the cascode circuit;

an N-channel output transistor configured to amplify a voltage output from a node of connection between the cascode circuit and the third electric current source; and a phase compensation capacitor connected to the node, wherein each of the transistors of the cascode circuit includes a source and a back gate directly connected to each other.

2. The folded cascode operational amplifier circuit according to claim 1, wherein
the first electric current source supplies more electric current than the third electric current source.

3. The folded cascode operational amplifier circuit according to claim 1, wherein
each of the transistors of the cascode circuit includes:
a P well formed in an N-type semiconductor substrate, and
an N channel MOSFET formed at an upper portion of the P well, a source of the N-channel MOSFET being connected to the P well as a back gate.

4. The folded cascode operational amplifier circuit according to claim 1, wherein
each of the transistors of the cascode circuit includes:
an N well formed in a P-type semiconductor substrate,
a P well formed at an upper portion of the N well, and
an N channel MOSFET formed at an upper portion of the P well, a source of the N-channel MOSFET being connected to the P well as a back gate.

5. The folded cascode operational amplifier circuit of claim 1, wherein a drain of each of the N-channel transistors of the first pair of N-channel transistors is connected to a drain of a separate P-channel transistor of the differential pair.

6. The folded cascode operational amplifier circuit of claim 1, wherein a source of each of the N-channel transistors of the second pair of N-channel transistors is connected to a drain of a separate N-channel transistor of the first pair of N-channel transistors.

7. A folded cascode operational amplifier circuit, comprising:
a first electric current source including at least one transistor;
a differential transistor pair including a pair of transistors, wherein electric current is supplied from the first electric current source to the differential pair, and a differential voltage is input into the differential pair;
a second electric current source including a pair of transistors that return electric current output from the differential pair;
a cascode circuit including a pair of transistors that are cascode-connected to the second electric current source, each of the transistors of the cascode circuit including a source and a back gate directly connected to each other;
a third electric current source including a pair of transistors, for supplying electric current to the cascode circuit; and
an output transistor configured to amplify a voltage output from a node of connection between the cascode circuit and the third electric current source.

8. The folded cascode operational amplifier circuit of claim 7, wherein each of the transistors of the cascode circuit comprises:
a P well formed in an N-type semiconductor substrate, and
an N channel MOSFET formed at an upper portion of the P well, a source of the N-channel MOSFET being connected to the P well as a back gate.

9. The folded cascode operational amplifier circuit of claim 7, wherein each of the transistors of the cascode circuit comprises:
an N well formed in a P-type semiconductor substrate;
a P well formed at an upper portion of the N well; and
an N channel MOSFET formed at an upper portion of the P well, a source of the N-channel MOSFET being connected to the P well as a back gate.

10. The folded cascode operational amplifier circuit of claim 7, wherein a gate of a first transistor of the differential transistor pair is connected to an output of the output transistor.

* * * * *